United States Patent [19]

Hecht et al.

[11] Patent Number: 5,404,753
[45] Date of Patent: Apr. 11, 1995

[54] MASS FLOW SENSOR

[75] Inventors: Hans Hecht, Korntal; Wolfgang Kienzle, Hemmingen; Rudolf Sauer, Benningen; Eckart Reihlen, Reutlingen; Kurt Weiblen, Metzingen, all of Germany

[73] Assignee: Robert Bosch GmbH, Stuttgart, Germany

[21] Appl. No.: 69,888

[22] Filed: Jun. 1, 1993

[30]    Foreign Application Priority Data

Jun. 13, 1992 [DE] Germany .................. 42 19 454.7

[51] Int. Cl.⁶ .............................................. G01F 1/68
[52] U.S. Cl. .................................................. 73/204.22
[58] Field of Search ........... 73/204.21, 204.22, 204.23, 73/204.25, 204.26

[56]    References Cited

U.S. PATENT DOCUMENTS

| | | | |
|---|---|---|---|
| 4,403,506 | 9/1983 | Lauterbach | 73/204 |
| 4,548,078 | 10/1985 | Bohrer et al. | 73/204.26 X |
| 4,587,844 | 5/1986 | Sumal | 73/204.26 X |
| 4,685,331 | 8/1987 | Renken et al. | 73/204 |
| 4,829,818 | 5/1989 | Bohrer | 73/204 |
| 4,870,860 | 10/1989 | Ohta et al. | 73/204.26 |
| 4,884,443 | 12/1989 | Lee et al. | |
| 4,976,145 | 12/1990 | Kienzle et al. | 73/204 |
| 5,167,147 | 12/1992 | Peters | 73/204.21 X |

FOREIGN PATENT DOCUMENTS

| | | |
|---|---|---|
| 0094497 | 11/1983 | European Pat. Off. . |
| 2900220 | 9/1987 | Germany . |
| 3844354 | 7/1990 | Germany . |
| 0194317 | 8/1986 | Japan ........................... 73/204.26 |
| 89/05963 | 6/1989 | WIPO . |
| WO89/05967 | 6/1989 | WIPO . |

*Primary Examiner*—Herbert Goldstein
*Attorney, Agent, or Firm*—Kenyon & Kenyon

[57]    ABSTRACT

A mass flow sensor detects the intensity of a media flow. The mass flow sensor includes a measurement chip, with a dielectric membrane and a frame of monocrystalline silicon. At least one heater is arranged on the membrane. The measurement chip is installed in the in-flow channel of a housing. By means of the structure of the housing, contamination of the measurement chip is reduced, thermal equalization with the media flow is improved, the resistance of the sensor to sudden pressure variations is increased, and the dielectric contacts are improved.

10 Claims, 3 Drawing Sheets

MASS FLOW SENSOR

FIELD OF THE INVENTION

The present invention relates to sensors and in particular to a mass flow sensor.

BACKGROUND INFORMATION

A mass flow sensor is described in International Application No. WO 89/05963, in which a dielectric membrane is arranged in a frame of monocrystalline silicon. Heating elements and temperature measurement elements are arranged on the membrane. Other temperature measurement elements are arranged on the silicon frame.

SUMMARY OF THE INVENTION

The mass flow sensor according to the present invention includes a measuring chip installed in an in-flow channel of a housing. The measuring chip includes a dielectric membrane disposed on a surface of a silicon frame, adjacent to the in-flow channel. A heating element is used to heat the membrane.

An advantage of the mass flow sensor according to the present invention is that precisely defined and easily reproducible flow conditions on the surface of the measurement chip are achieved by the installation of the measurement chip in the in-flow channel of a housing. Another advantage is that better protection of the measurement chip against mechanical stress and particles conducted in the media flow can be achieved by the installation of the measurement chip in the in-flow channel.

By an acceleration of the mass flow in the in-flow channel, the deposit of dirt particles on the measurement chip is reduced. Furthermore, the release of vortexes, which result in greater noise, is suppressed and, thus, the measurement is improved. This acceleration is achieved in a particularly simple manner by narrowing the cross-section of the in-flow channel in the flow direction. In a particularly advantageous embodiment, the smallest cross-section in the flow direction lies after the measurement chip, because, in this way, it can be ensured that the air is accelerated also above the sensor.

By installing the measurement chip flush in a wall of the in-flow channel, edges in the flow channel, which lead to especially severe dirt deposits, are avoided. By connecting the frame flush, a good thermal contact with the housing is ensured. Mechanical torsion stresses in the membrane are reduced if the surface is glued down on only one side of the membrane. Adaptation of the housing temperature to the temperature of the media flow is improved with a cooling element.

To protect the dielectric membrane against a sudden pressure increase of the media flow and thermal expansion of the gas enclosed between the measurement chip and the housing, the housing has a vent hole. In order to prevent flow on the bottom of the membrane in this connection, the cross-section of the vent hole should be less than the length of the vent hole.

Particularly well-sealed installation of the measurement chip in the housing is achieved by using a sealing lip. If the sealing lip rests on the frame, the assembly of the measurement chip and the housing is particularly simple. The mechanical stress on the measurement chip is reduced in that the sealing lip has a slight gap towards the frame, and this gap is closed off with adhesive. By means of the arrangement of the membrane and the bond pads on different sides of the sealing lip, a clear separation of the measurement region from the electrical connection region is achieved. This separation particularly allows the use of circuits or other sensitive elements in the immediate vicinity of the membrane, without any influence on these elements by the media flow.

DETAILED DESCRIPTION

Figure 1A:
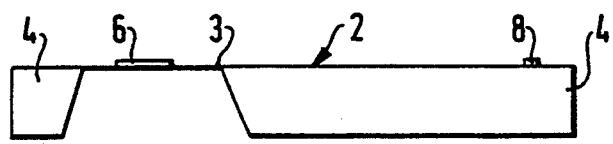
FIGS. 1a and 1b show cross-sectional and top views, respectively, of a measurement chip.
Figure 1B:
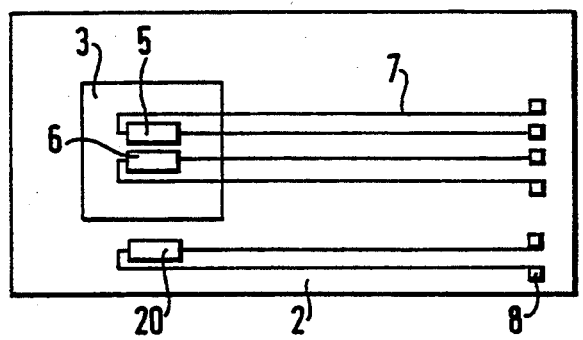

FIG. 1a shows a measurement chip 2 in cross-section, and FIG. 1b shows the measurement chip 2 in a top view. A dielectric membrane in a frame 4 of monocrystalline silicon is designated by the reference numeral 3. At least one heater 5 and at least one temperature sensor 6 are arranged on the membrane 3. Another reference temperature sensor 20 is arranged on the frame 4. The heater 5, the temperature sensor 6 and the reference temperature sensor 20 are connected to bond pads 8 by means of tracks (printed conductors) 7. An electrical contact between the heater 5, the temperature sensor 6, the reference temperature sensor 20 and the outside world is produced by means of the tracks 7. By bonding wires to the bond pads 8, an electrical connection to external circuits (not shown) can be produced.

The dielectric membrane 3 is composed of, for example, silicon nitride and/or silicon oxide. These materials have low thermal conductivities and can be produced on the surface of a silicon wafer in a particularly simple manner. The self-contained membrane 3 is formed by etching the surface of a silicon wafer coated with a dielectric material. The corresponding etching methods are familiar to a person skilled in the art.

The heater 5 includes a resistor element, which generates heat on the membrane by means of a current flow sent through the tracks 7. The resistor element can be composed of a metal, for example, or of suitably doped silicon. The temperature sensor 6 and the reference temperature sensor 20 can include a resistor element, for example, the conductivity of which is dependent upon temperature. Suitable materials for this resistor element are metals or suitably doped silicon. An element which utilizes the temperature difference between the membrane and the frame via the Seebeck effect can also be used for the temperature sensor 6.

With this measurement chip 2, the value of a mass flow can be determined, where the flow direction is parallel to the surface of the measurement chip 2. The membrane 3 is kept at a temperature which is greater than the temperature of the mass flow, by means of the heater 5. The amount of heat conducted away from the membrane 3 by the mass flow is dependent upon the intensity of the mass flow. By measuring the temperature of the membrane 3, the intensity of the mass flow can be determined in this way. The membrane temperature can be measured by means of the temperature sensor 6, or by measuring the resistance of the heater 5. The reference temperature sensor 20 is used to eliminate the influence of the temperature of the medium that is flowing past the membrane 3. In this connection, it is assumed that the frame 4 is at the temperature of the flowing medium. Experience has shown that such a measurement chip is very sensitive to contamination of the surface, which can be caused by dirt particles, for example.

Figure 2:
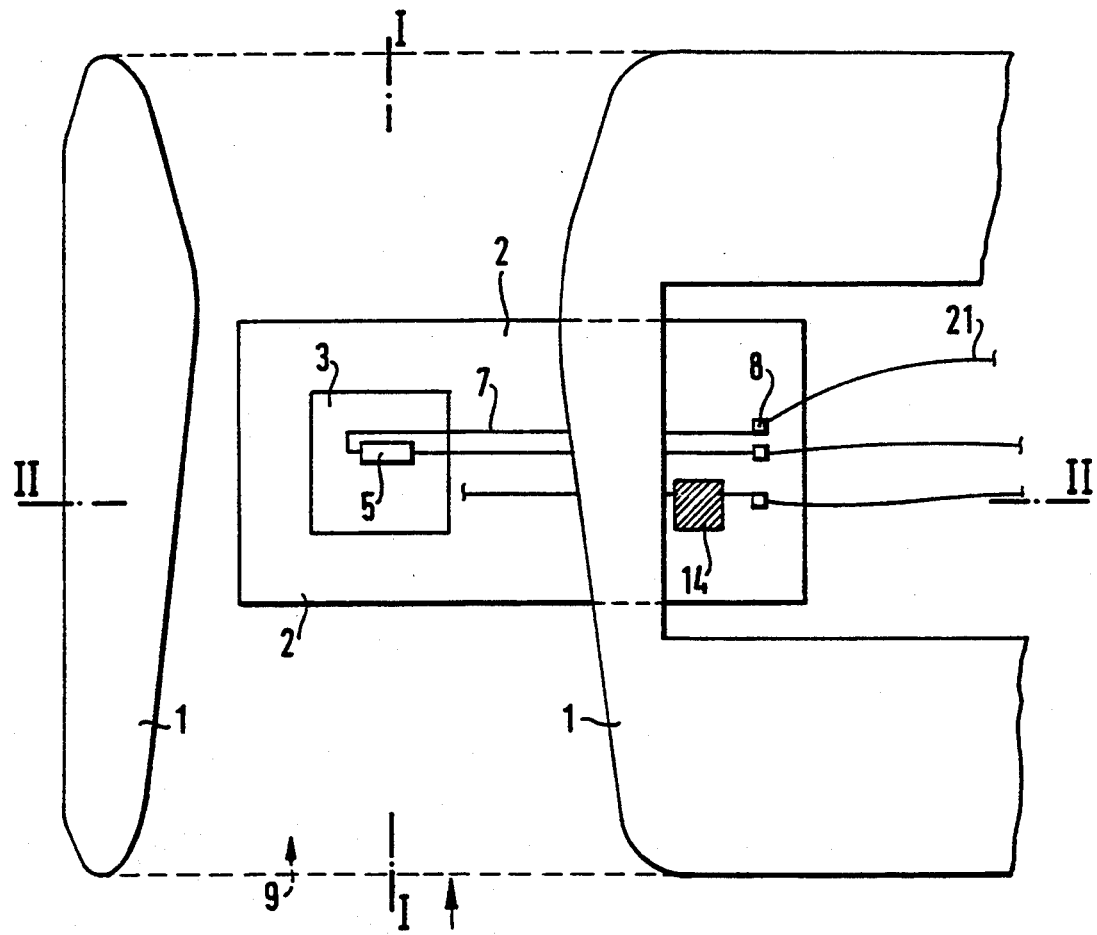
FIGS. 2, 3 and 4 show top, longitudinal cross-sectional (along line I—I in FIG. 2) and cross-sectional (along line II—II in FIG. 2) views, respectively, of a first embodiment of the mass flow sensor according to the present invention.

FIG. 2 shows a top view of the mass flow sensor according to the present invention. The measurement chip 2 is installed in the in-flow channel 9 of the housing 1. The direction of the flow through the in-flow channel is indicated by the arrow. For the sake of simplicity, the representation of the temperature sensor 6 and the reference temperature sensor 20 are eliminated in the representation of the measurement chip 2. The heater 5, arranged on the membrane 3, is connected to the bond pads 8 by means of tracks 7. An electrical contact to circuits (not shown) is produced by means of the bond wires 21. Circuits arranged directly on the measurement chip are schematically represented as 14. With these circuits 14, processing of the signals of the temperature sensor 6 and the reference temperature sensor 20, i.e. control of the heater 5, can be carried out. By means of the monolithic integration of the circuits with the measurement chip, the latter becomes more sensitive, the resistance to disruptions is increased, and the costs are potentially reduced.

The cross-section of the in-flow channel 9 decreases along the flow direction. The smallest cross-section is located after the measurement chip, in the flow direction. As such, the deposit of dirt particles on the measurement chip 2 is reduced. Furthermore, the release of vortexes on the surface of the chip is suppressed, and the resulting lower noise improves the measurability of the sensor signal.

Figure 3:
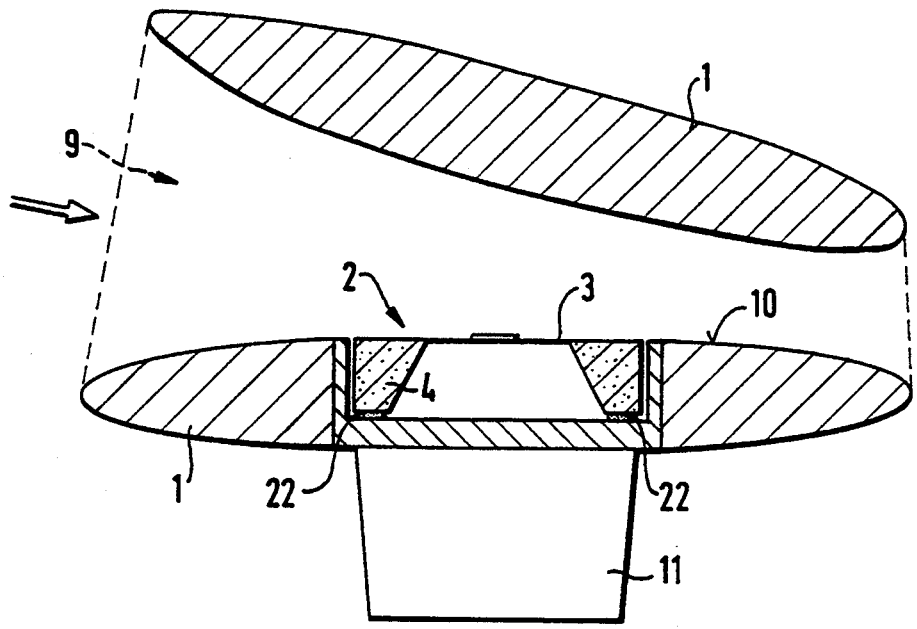

FIG. 3 shows a longitudinal cross-section through the mass flow sensor of FIG. 2, along line I—I. The measurement chip 2 is installed in the housing 1 in such a way that the membrane 3 and the frame 4 are flush with a wall 10 of the in-flow channel 9. The frame 4 is glued to an area of the housing 1 by means of adhesive 22. The cross-section of the in-flow channel 9 narrows such that the smallest cross-section is after the measurement element 2, in the flow direction. Furthermore, the housing 1 has a cooling element (heat sink) in the form of cooling ribs 11. The cooling ribs 11 are oriented parallel to the media flow (see arrow) with the longitudinal side.

Because of the flush installation of the measurement chip 2, edges are avoided in the in-flow channel 9; these are known to cause many dirt particles to collect. Because dirt particles, particularly in the vicinity of the membrane 3, change the characteristic of the measurement chip, the flush installation improves the long-term stability of the output signal of the mass flow sensor. In order to reduce the influence of the temperature of the media flow, the reference temperature sensor 20 must have approximately the temperature of the media flow. For this purpose, the measurement chip 2 is glued to the housing with a large part of its surface. As such, good thermal contact between the measurement chip 2 and the housing 1 is ensured. Furthermore, the cooling element 11 must give off a sufficient amount of heat to the media flow, in order to balance out the heating of the frame 4 caused by the heater 5. In addition, the temperature adjustment of the frame should take place quickly in case of a temperature change in the medium. The housing 1 and the cooling element 11 therefore have a low mass and are made from materials having a low specific heat capacity. By means of a large surface-to-volume ratio of the cooling element, for example by structuring the cooling element as cooling ribs, a large transfer of heat to the medium and a rapid adjustment to a change in temperature are guaranteed.

Figure 4:
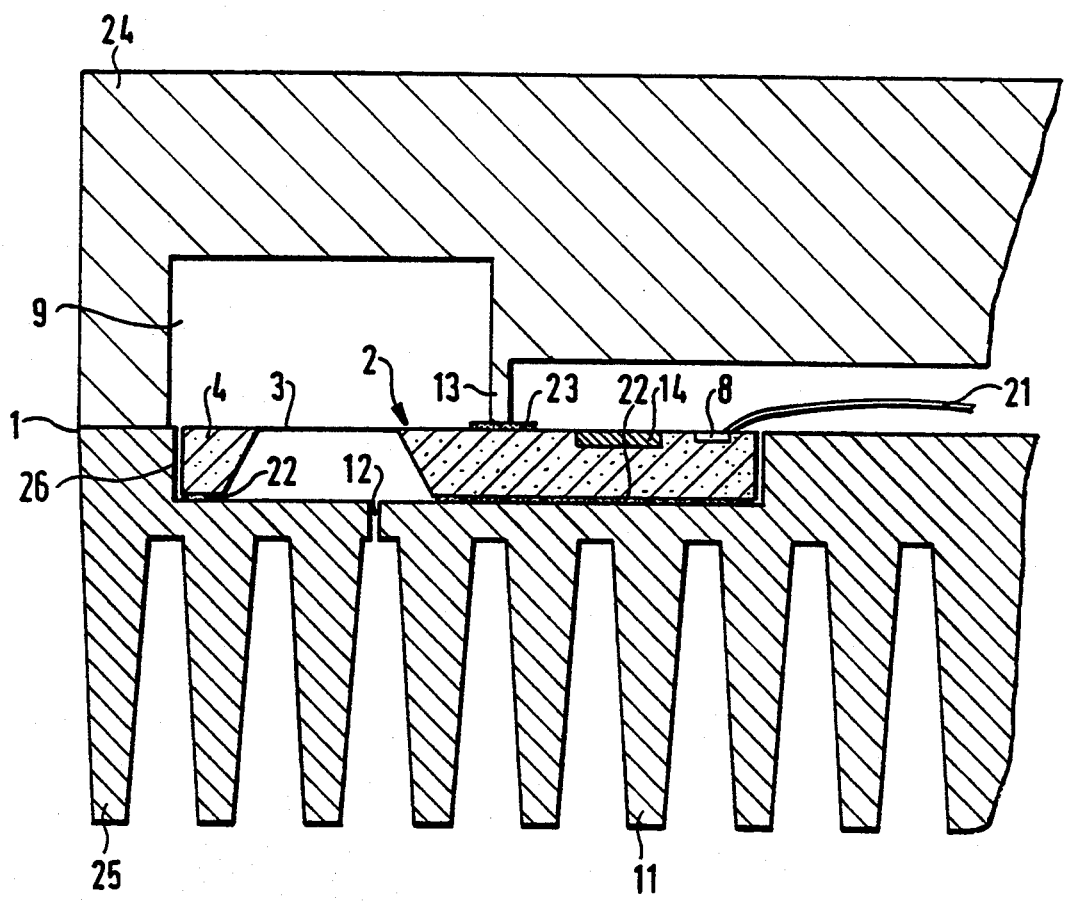

FIG. 4 shows a cross-section through the mass flow sensor, along line II—II of FIG. 2. The housing 1 includes an upper part 24 and a lower part 25. The measurement chip 2 is installed in a recess 26 of the lower part 25 of the housing 1. The frame 4 is glued flush with the lower part 25 of the housing 1 by means of adhesive 22. The measurement chip 2 further has circuits 14 and a bond pad 8. The measurement chip 2 is connected to other circuits by means of a bond wire 21. Furthermore, the lower part of the housing has cooling ribs 11. The bottom of the membrane 3 is vented by means of a vent hole 12. The upper housing part 24 has a sealing lip 13, which is connected to the measurement chip 2 by means of adhesive 23.

By means of the vent hole 12, a pressure difference between the top and bottom of the membrane 3 is avoided. Since the membrane 3 is very thin, in order to keep the thermal conductivity of the membrane low, there is a risk that the membrane will be destroyed if there are pressure differences. However, it is undesirable for flow to occur in the cavity formed by the membrane 3, the frame 4 and the lower housing part 25, since dirt particles can be deposited in this case. The cross-section of the vent hole 12 should therefore be less than its length.

The top of the measurement chip 2 is divided into regions by the sealing lip 13. The membrane 3 and the in-flow channel 9 are located in one region. The circuits 14, the bond pads 8 and the bond wires 21 are located on the other side of the sealing lip 13. This division ensures that the circuits 14, the bond pads 8 and the bond wires 21 will be protected against disruptive influences of the media flow. A hermetic separation between these two regions is achieved by setting the sealing lip 13 onto the frame 4 or by using an adhesive layer 23 between the sealing lip 13 and the frame 4.

Figure 5:
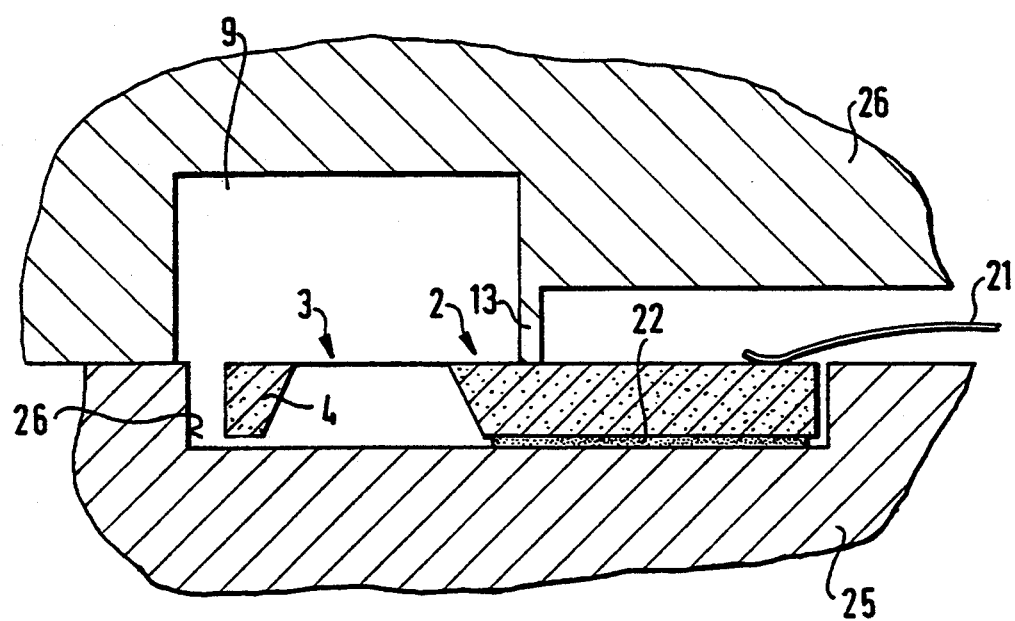
FIG. 5 shows a cross-sectional view of a second embodiment of the mass flow sensor according to the present invention.

FIG. 5 shows another embodiment of the mass flow sensor according to the present invention, in which the measurement chip 2 is glued to the lower housing part 25 only on one side of the membrane 3, and the recess 26 of the lower housing part 25 for the measurement chip 2 is slightly larger than the measurement chip 2. The result achieved is that the measurement chip 2 can expand if it heats up, without creating any distortion relative to the housing 1. The sealing lip 13, which is formed out of the upper housing part 24 and separates the membrane 3 and the bond wires 21, is elastic and set onto the measurement chip 2 without gluing. The seal can again be improved by gluing. In this embodiment of the mass flow sensor according to the present invention, the lower housing part 25 does not have a vent hole, because pressure equalization between the top and bottom of the membrane can take place by means of the vent hole formed by the measurement chip 2 and the lower housing part 25.

What is claimed is:

1. A mass flow sensor comprising:
 a housing having a flow channel and a sealing lip, an interior side of the sealing lip defining a first side of the flow channel;

a measuring chip including a semiconductive frame bonded to the housing;

the sealing lip connected to a central portion of the frame for sealing the flow channel;

a first portion of the frame being on the interior side of the sealing lip and a second portion of the frame being on a posterior side of the sealing lip;

a surface of the first portion of the frame being flush with a wall of the flow channel thereby forming a smooth flow channel;

a closed dielectric membrane disposed on the surface of the first portion of the frame and adjacent to the flow channel, the membrane being suspended from the frame on all sides;

a heating element coupled to the membrane for heating the membrane;

at least one bonding wire coupled to at least one bond pad on the second portion of the frame, the at least one bond pad coupled to at least one track in the semiconductive frame, the at least one track coupled to the heating element.

2. The mass flow sensor according to claim 1, wherein the frame is made of monocrystalline silicon.

3. The mass flow sensor according to claim 1, wherein a geometry of the flow channel accelerates the mass flow.

4. The mass flow sensor according to claim 1, wherein a cross-section of the flow channel narrows in a direction of flow.

5. The mass flow sensor according to claim 1, wherein the flow channel tapers in a direction of flow, the tapering of the flow channel accelerating the mass flow, a smallest cross-section of the flow channel being after the measuring chip in the direction of flow.

6. The mass flow sensor according to claim 1, wherein the housing further has a vent for venting a bottom side of the membrane.

7. The mass flow sensor according to claim 1, further comprising an adhesive for connecting the sealing lip to the frame.

8. The mass flow sensor according to claim 1, wherein the measuring chip further includes monolithically integrated circuits adjacent to the bond pad.

9. The mass flow sensor according to claim 1, wherein the housing further has a heat sink including a plurality of cooling ribs.

10. The mass flow sensor according to claim 1, wherein the measuring chip further includes a temperature sensor coupled to the membrane.

* * * * *